(12) United States Patent
Kamata

(10) Patent No.: US 10,211,118 B2
(45) Date of Patent: Feb. 19, 2019

(54) SEMICONDUCTOR MODULE

(71) Applicant: KABUSHIKI KAISHA TOSHIBA, Tokyo (JP)

(72) Inventor: Shuji Kamata, Nonoichi Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/690,250

(22) Filed: Aug. 29, 2017

(65) Prior Publication Data

US 2018/0286775 A1 Oct. 4, 2018

(30) Foreign Application Priority Data

Mar. 29, 2017 (JP) ................... 2017-065618

(51) Int. Cl.
*H01L 23/31* (2006.01)
*H01L 23/373* (2006.01)
(Continued)

(52) U.S. Cl.
CPC ...... *H01L 23/3121* (2013.01); *H01L 21/4871* (2013.01); *H01L 21/565* (2013.01);
(Continued)

(58) Field of Classification Search
CPC . H01L 23/3121; H01L 24/85; H01L 23/3735; H01L 23/04; H01L 23/296; H01L 24/48; H01L 21/4871; H01L 21/565; H01L 23/492; H01L 2224/48091; H01L 2224/48106; H01L 2224/48247; H01L 2224/49176; H01L 2924/35121;
(Continued)

(56) References Cited

U.S. PATENT DOCUMENTS

2006/0108601 A1* 5/2006 Okamoto .................. C23C 4/02
257/177
2013/0009298 A1* 1/2013 Ota ......................... H01L 23/24
257/676
(Continued)

FOREIGN PATENT DOCUMENTS

JP 2003-179203 A 6/2003
JP 2005-123239 A 5/2005
(Continued)

*Primary Examiner* — Victor A Mandala
(74) *Attorney, Agent, or Firm* — Patterson & Sheridan, LLP

(57) ABSTRACT

A semiconductor module includes a metal substrate having a mounting surface, a first conductive plate on the mounting surface, an insulating substrate on the first conductive plate, a second conductive plate on the insulating substrate, a conductive pad on the insulating substrate, a semiconductor element on the second conductive plate, a circuit board electrically connected to the conductive pad, a resin case connected to the metal substrate and extending along at least a portion thereof, and around the first conductive plate, the insulating substrate, the second conductive plate, the conductive pad, the semiconductor element, and the circuit board, and a silicone gel in a region bounded by the metal substrate and the resin case. The circuit board comprises a plurality of planar surfaces oriented perpendicular to the mounting surface of the metal substrate.

18 Claims, 3 Drawing Sheets

(51) Int. Cl.
*H01L 23/04* (2006.01)
*H01L 23/29* (2006.01)
*H01L 23/00* (2006.01)
*H05K 1/02* (2006.01)
*H05K 1/11* (2006.01)
*H01L 21/48* (2006.01)
*H01L 21/56* (2006.01)
*H01L 23/492* (2006.01)
*H01L 25/00* (2006.01)
*H01L 25/065* (2006.01)

(52) U.S. Cl.
CPC ............ *H01L 23/04* (2013.01); *H01L 23/296* (2013.01); *H01L 23/3735* (2013.01); *H01L 23/492* (2013.01); *H01L 24/48* (2013.01); *H01L 24/85* (2013.01); *H05K 1/028* (2013.01); *H05K 1/0271* (2013.01); *H05K 1/111* (2013.01); *H01L 24/45* (2013.01); *H01L 25/0655* (2013.01); *H01L 25/50* (2013.01); *H01L 2224/45124* (2013.01); *H01L 2224/45144* (2013.01); *H01L 2224/48091* (2013.01); *H01L 2224/48106* (2013.01); *H01L 2224/48247* (2013.01); *H01L 2224/49176* (2013.01); *H01L 2924/35121* (2013.01)

(58) Field of Classification Search
CPC ........... H01L 2224/45144; H01L 24/45; H01L 25/50; H01L 25/0655; H01L 2224/45124; H05K 1/028; H05K 1/111; H05K 1/0271
See application file for complete search history.

(56) References Cited

U.S. PATENT DOCUMENTS

| | | | | |
|---|---|---|---|---|
| 2013/0032845 | A1* | 2/2013 | Chuang | H01L 33/0079 257/99 |
| 2014/0035123 | A1* | 2/2014 | Oka | H01L 23/367 257/712 |
| 2014/0124936 | A1* | 5/2014 | Yanagawa | H01L 25/072 257/762 |
| 2014/0299894 | A1* | 10/2014 | Lin | F21K 9/00 257/88 |
| 2014/0319669 | A1* | 10/2014 | Kimijima | H01L 23/42 257/687 |
| 2015/0270201 | A1* | 9/2015 | Kim | H01L 23/49568 257/676 |
| 2017/0012030 | A1* | 1/2017 | Wang | H01L 25/162 |
| 2017/0025344 | A1* | 1/2017 | Kanai | H01L 23/49894 |
| 2017/0263527 | A1* | 9/2017 | Mohn | H01L 24/49 |

FOREIGN PATENT DOCUMENTS

| | | |
|---|---|---|
| JP | 2008-85112 A | 4/2008 |
| JP | 2013-179203 A | 9/2013 |

\* cited by examiner

SEMICONDUCTOR MODULE

CROSS-REFERENCE TO RELATED APPLICATION

This application is based upon and claims the benefit of priority from Japanese Patent Application No. 2017-065618, filed Mar. 29, 2017, the entire contents of which are incorporated herein by reference.

FIELD

An embodiment of the present disclosure relates to a semiconductor module.

BACKGROUND

The internal structure of a semiconductor module is formed such that a semiconductor element and a circuit board are disposed therein parallel to each other, and the semiconductor element, such as a semiconductor die, and the circuit board are sealed with a silicone gel. During use of the semiconductor module, the circuit board may thermally deform due to temperature cycling associated with switching on and off of the semiconductor element, and thus the silicone gel may peel off of components of the semiconductor module, causing failure thereof.

DETAILED DESCRIPTION

Figure 1:
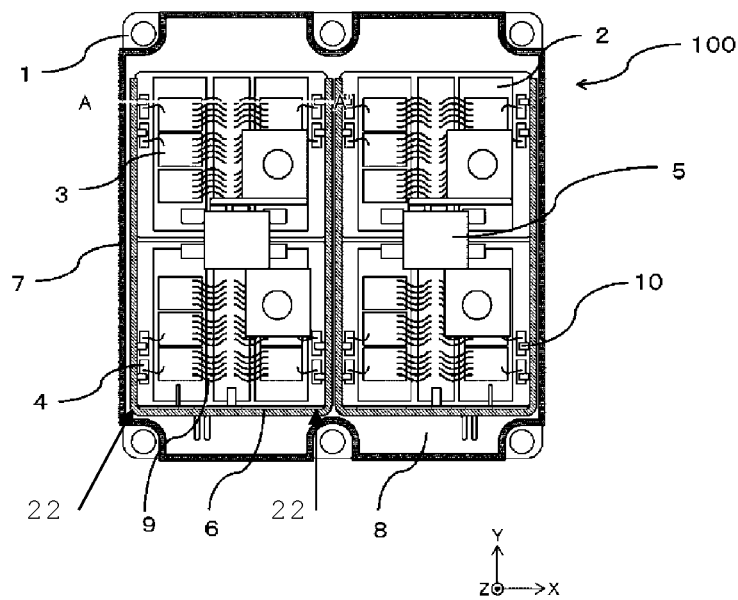
FIG. 1 is a schematic top view of a semiconductor module according to a first embodiment.

Embodiments provide a semiconductor module capable of relieving stress on a silicone gel encapsulating the semiconductor module that are cause by thermal deformation of a circuit board of the semiconductor module.

In general, according to one embodiment, a semiconductor module includes a metal substrate having a mounting surface, a first conductive plate on the mounting surface, an insulating substrate on the first conductive plate, a second conductive plate on the insulating substrate, a conductive pad on the insulating substrate, a semiconductor element on the second conductive plate, a circuit board electrically connected to the conductive pad, a resin case connected to the metal substrate and extending along at least a portion thereof, and around the first conductive plate, the insulating substrate, the second conductive plate, the conductive pad, the semiconductor element, and the circuit board, and a silicone gel in a region bounded by the metal substrate and the resin case. The circuit board comprises a plurality of planar surfaces oriented perpendicular to the mounting surface of the metal substrate.

An embodiment will be described below with reference to the accompanying drawings. In the following description, the same numbers are assigned to the same elements and the description of an element which was previously described is omitted later as appropriate.

In the drawings, the relationship between the thickness and width of each element, and the size ratio between elements do not always reflect the actual dimension thereof in an actual module. Further, even where the same element is shown in different drawings, the respective dimensions and ratios thereof may be shown differently in different drawings.

First Embodiment

Figure 2:
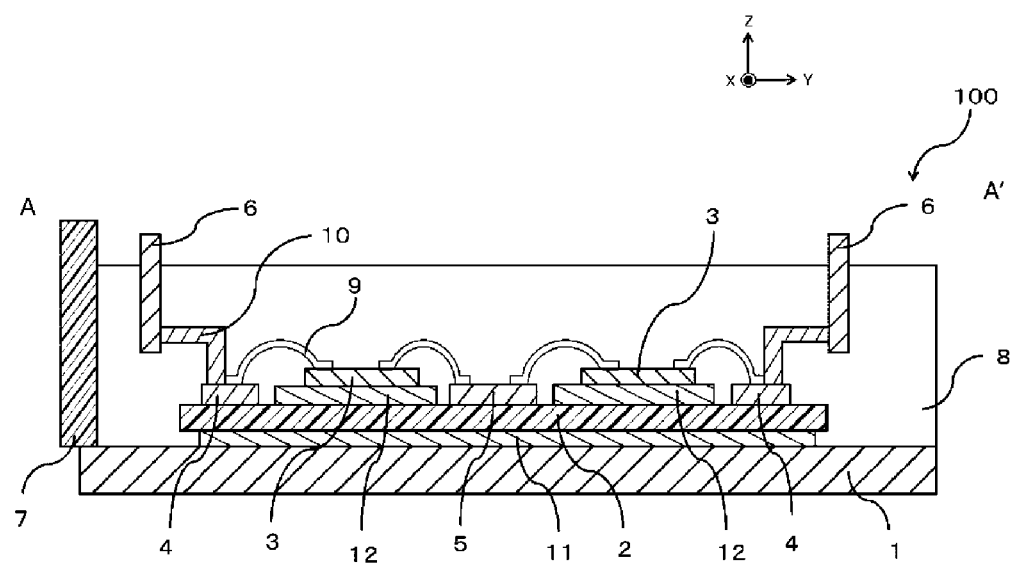
FIG. 2 is a schematic cross-sectional view taken along the line A-A' of the semiconductor module according to the first embodiment shown in FIG. 1.
Figure 3:
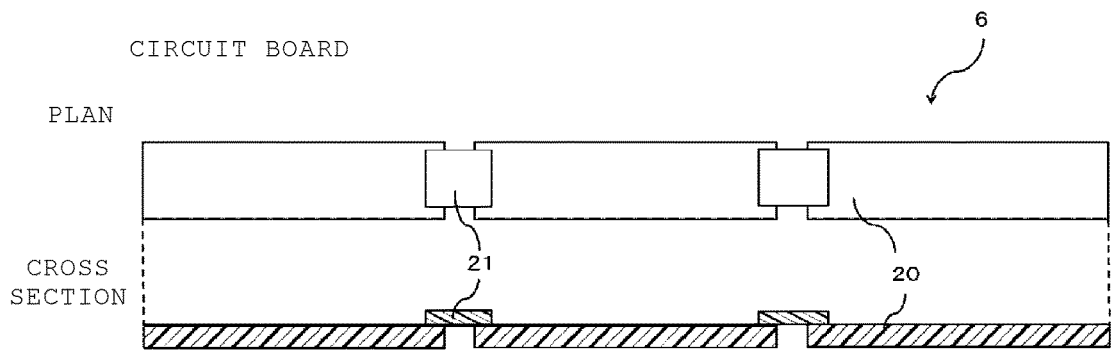
FIG. 3 shows a plan view and a cross-sectional view of a circuit board.

A first embodiment of the present disclosure will be described with reference to FIGS. 1 to 3. FIG. 1 is a schematic top view of a semiconductor module according to the first embodiment. FIG. 2 is a schematic cross-sectional view taken along the line A-A' of the semiconductor module according to the first embodiment shown in FIG. 1. FIG. 3 shows a plan view and a cross-sectional view of a circuit board 6.

Firstly, the configuration of the semiconductor module 100 according to the first embodiment will be described. As shown in FIGS. 1 and 2, the semiconductor module 100 includes a metal substrate 1, an insulating substrate 2, a semiconductor element 3, an electrode extraction pad 4, a main terminal 5, a circuit board 6, a resin case 7, a silicone gel 8, a bonding wire 9, an auxiliary terminal 10, a first conductor 11 and a second conductor 12.

The first conductor 11 is mounted over amounting surface of the metal substrate 1 and connected thereto by solder. The insulating substrate 2 is connected to the first conductor 11 by solder, and the second conductor 12, the electrode extraction pad 4 and the main terminal 5 are respectively connected to the insulating substrate 2 by solder. The semiconductor element 3 is located on the second conductor 12. The surface electrode of the semiconductor element 3 and the electrode extraction pad 4 are connected to each other by the bonding wire 9. In addition, the surface electrode of the semiconductor element 3 and the main terminal 5 are respectively connected to each other by the bonding wire 9.

The metal substrate 1 is joined to the resin case 7 which extends substantially along the perimeter of the metal substrate 1, and a silicone gel 8 is located on or contacting portions of the metal substrate 1, the insulating substrate 2, the semiconductor element 3, the electrode extraction pad 4, the main terminal 5, the circuit board 6, the bonding wire 9, the auxiliary terminal 10, the first conductor 11 and the second conductor 12 exposed within the perimeter of the surrounding and silicone gel 8 contacting resin case 7.

A first end of the auxiliary terminal 10 is connected to the electrode extraction pad 4. A second end of the auxiliary terminal 10 is connected to the circuit board 6.

A wiring pattern for connecting a plurality of elements, a signal terminal, a gate resistor, a drive circuit, a self-protection function circuit and the like are located on the circuit board 6. The circuit board 6 includes a generally planar surface oriented in the Z direction, and it also extends perpendicularly to the direction of the interface between the metal substrate 1 and the insulating substrate 2, and is located so as not to overlie the semiconductor element 3 in the Z direction. As shown in FIG. 1, a circuit board 6 has a generally "U" shape in plan view, and it is spaced in the x and y directions from the sides of two adjacent insulating substrates 2 connected to the single metal substrate 1 toward the perimeter of the metal substrate 1, and is also spaced further from the metal substrate in the z-direction than are the uppermost surfaces of the two adjacent insulating substrates 2 connected to the single metal substrate 1. Thus, the circuit board 6 is above, and offset from the sides of, the insulating substrates 2, and thus does not overlie an insulating substrate 2 or any other module component thereon or thereover.

As shown in FIG. 3, the circuit board 6 is configured from generally flat and rigid substrates 20 and flexible substrates 21, wherein adjacent ends of adjacent rigid substrates 20 are connected by the flexible substrates 21. When the circuit board 6 is disposed perpendicular to the direction of the interface between the metal substrate 1 and the insulating substrate 2, the circuit board 6 is bent at the location of the flexible substrates 21 to include curved edge portions 22, and in the embodiment, three flat rigid substrate 20 portions, wherein one flat rigid substrate 20 is connected at its opposed ends to adjacent flat rigid substrate 20 by the bent or curved flexible substrates 21, are provided as shown in FIG. 1. A flexible substrate 21 is used to provide the curved edge portion 22, i.e., the curve or bend between the sides and the base of a "U" shape, and the rigid type substrate 20 is used as the remaining generally flat or planar portions of the circuit board 6, i.e., as the sides and base of the "U" shape. The auxiliary electrode 10 is connected at one end thereof to a rigid substrate 20 of the circuit board 6. However, the entirety of the circuit board 6 may be formed by a rigid type substrate 20 extending adjacent to, and spaced from, the side of an insulating substrate 2 and the components thereon or thereover.

An example of the material of each component will be described.

The metal substrate 1 contains copper as the main component thereof. Alternatively, it may contain aluminum as the main component thereof. Alternatively, it may contain metal and ceramic (for example, an aluminum silicon carbide composite material) as the main component thereof.

The insulating substrate 2 is, for example, a ceramic stacked substrate.

For example, copper is used for the first conductor 11 and the second conductor 12.

The bonding wire 9 is made of, for example, aluminum or gold.

The rigid type substrate 20 is mainly made of, for example, polyimide. The flexible substrate 21 is mainly made of, for example, glass epoxy resin.

<Operation and Effect>

Here, the operation and effects of the semiconductor module 100 according to the first embodiment will be described with reference to FIGS. 1 to 6.

In the semiconductor module 100, heat is generated during the use thereof, and a temperature cycle of the semiconductor module 100 of a high temperature and a low temperature is repeated. With this temperature cycle, the circuit board 6 and the like repeatedly expands and contracts, and stress is generated within the semiconductor module 100 as a result of each temperature cycle.

In the semiconductor module 100 according to the first embodiment, the circuit board 6 includes a plurality of generally planar portions oriented in the Z-direction and extending in the x- and y-directions perpendicular to the z-direction extending between the metal substrate 1 and the insulating substrate 2, and it is also offset toward the sides of the module 100 along the base of the "U" shape in the y-direction and likewise offset along the sides of the "U" shape toward the sides of the module 100 in the x-direction" so as to not overlie the area above the bonding wire 9 in the z-direction. Likewise, the lower surface of the entire circuit board 6 is offset in the z-direction from metal substrate 1, the insulating substrate 2, the semiconductor element 3, the electrode extraction pad 4, and the main terminal 5.

The circuit board 6 becomes thermally deformed and the silicone gel 8 is expanded and contracted by the temperature cycling associated with the use of the semiconductor module 100. However, in the case of the semiconductor module 100 according to the present embodiment, since the entirety of the silicone gel 8 is not surrounded by the circuit board 6 about its perimeter on all four sides thereof because of the open "end" of the "U" shape of the circuit board 6, or by the combination of the circuit board 6 and the auxiliary terminal 10, the insulating substrate 2 and the like, the silicone gel 8 is able to expand and contract with reduced stress at the interfaces thereof with the module components, and the stress applied during the expansion and shrinkage thereof is reduced.

As a result of the reduction of the stress imposed on the silicone gel 8 during temperature cycling of the semiconductor module, the joining interface of the bonding wire 9 connected to the surface electrode of the semiconductor element 3 is rarely pulled apart. In addition, the peeling away of the silicone gel 8 or the insulating substrate 2 at the interface between the insulating substrate 2 and the silicone gel 8, and the peeling away of the semiconductor element 3 or the silicone gel 8 at the interface between the semiconductor element 3 and the silicone gel 8 are suppressed, preventing moisture ingress to these components and moisture based dielectric breakdown of the semiconductor module 100 is thereby suppressed.

Next, the operation of a semiconductor module 200 according to a comparative example will be described. The effects of the semiconductor module 100 according to the first embodiment of the present disclosure will be further described using the comparative example.

Figure 4:
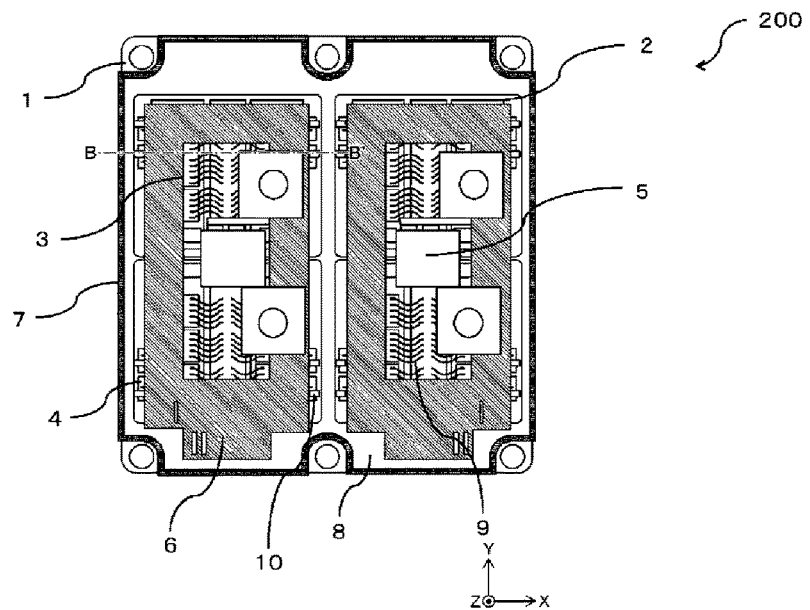
FIG. 4 is a schematic top view showing a semiconductor module according to a comparative example.
Figure 5:
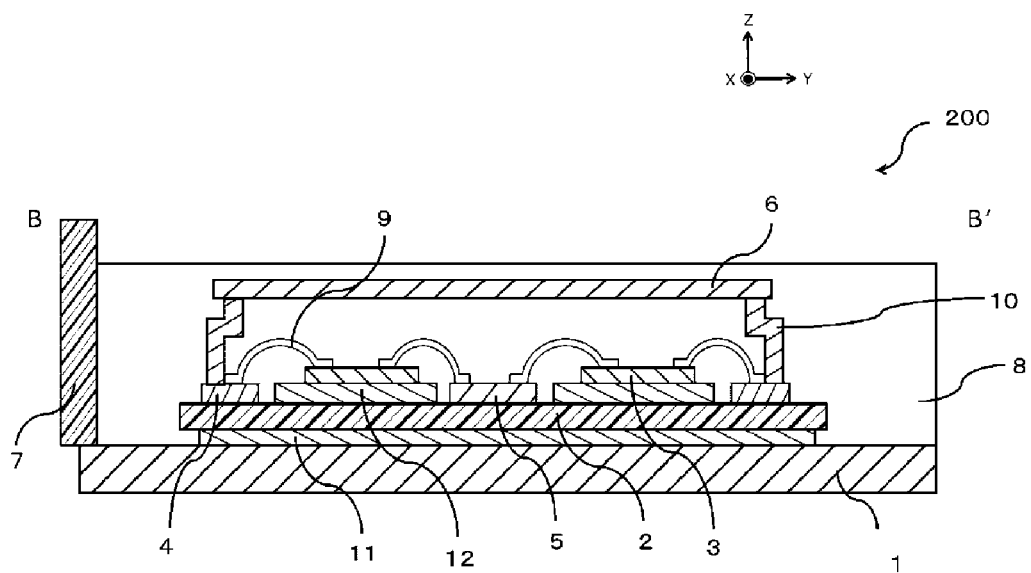
FIG. 5 is a schematic cross-sectional view taken along the line B-B' of the semiconductor module according to the comparative example.

As shown in FIGS. 4 and 5, the semiconductor module 200 according to the comparative example includes a semiconductor element 3 and a circuit board 6 for connecting a plurality of elements thereto. The components are substantially the same as those of the semiconductor module 100, except that the semiconductor element 3 and the circuit board 6 are disposed parallel to each other with the silicone gel 8 therebetween, and the circuit board 6 is located over, and spaced from, the bonding wire 9 with the silicone gel 8 therebetween.

Figure 6:
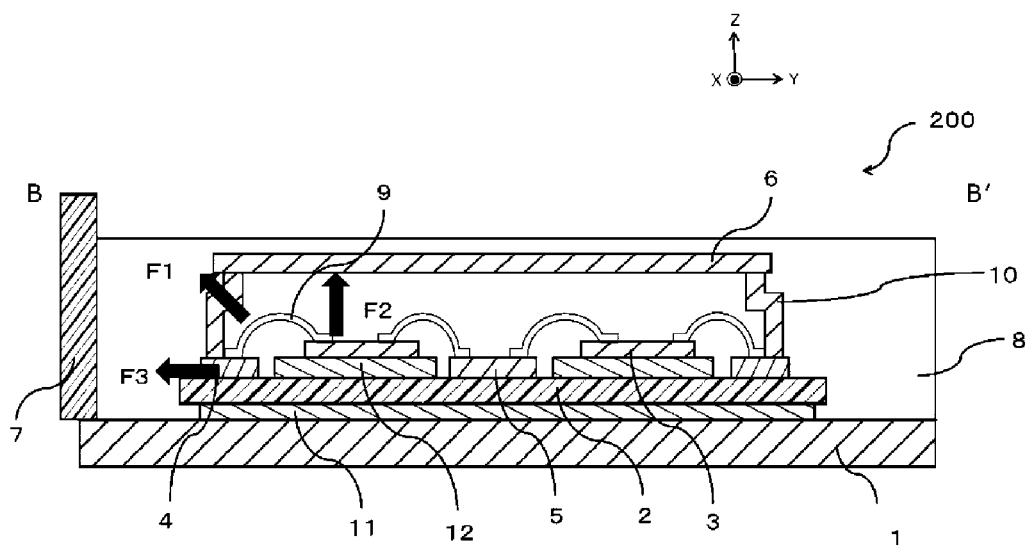
FIG. 6 is an explanatory view showing the tensile stress at an interface between the silicone gel and the semiconductor element of the semiconductor module according to the comparative example.

FIG. 6 shows illustrates the tensile stress at the interface between the semiconductor element 3 and the silicone gel 8 of the comparative example semiconductor module 200. The moving direction and the stress of the silicone gel act in the direction of the arrows shown in FIG. 6 during thermal cycling of the module 200.

As described above, the circuit board 6 may become deformed due to the temperature cycling during use. When the circuit board 6 thermally expands in the direction of the insulating substrate 2, the inner portion of the silicone gel 8 between the circuit board 6 and the insulating substrate 2 is pushed out in the F1 direction. Then, when cooled, the circuit board 6 thermally shrinks. When the circuit board 6 thermally shrinks, it pulls away from the insulating substrate 2 and the amount of the inner silicone gel 8 squeezed to resultantly move in the direction of arrow F1 is reduced, and, the tensile stress represented by arrow F2 acts on the bonding wire 9 tending to pull it off of the electrode extraction pad 4, the semiconductor element 3, or both.

Further, shear stress is generated on the insulating substrate 2 in the F3 direction due to thermal shrinkage of the circuit board 6.

As described above, the tensile stress and shear stress are applied as thermal shrinkage occurs.

During thermal expansion, elongation of the interface region parallel to the solder connected surfaces of the metal substrate 1 and the insulating substrate 2 is large. On the other hand, the tensile stress initially along the location where the circuit board 6 and the silicone gel 8 come into contact with each other is small. Therefore, it becomes likely that the interface between the circuit board 6 and the silicone gel 8 will peel apart, and the moisture isolation of the module components provided by the silicone gel is lost leading to failure of the semiconductor module 200. Further, the bonding wire 9 can be pulled by the silicone gel 8 as a result of the tensile stress resulting from thermal deformation of the silicone gel 8. As a result, the bonding wire 9 can be pulled away from the joining surface of the surface electrode of the semiconductor element 3 to which it is bonded and from the electrode extraction pad 4 to which it is bonded, resulting in a disconnection between the semiconductor element 3 and the electrode extraction pad 4, and a resulting reduction in reliability of the module.

In addition, a crack can occur which extends from a corner of the insulating substrate 2 and propagates inwardly thereof due to the shear stress. As a countermeasure to this problem, there is a technique of expanding an opening in the central region of the circuit board 6 shown in FIG. 4, but expanding the opening reduces the effective area of the circuit board 6. Further, as the opening is expanded, the line width of the wiring pattern located on the circuit board 6 becomes narrower for the same wiring pattern. Therefore, the resistance of the wiring pattern located on the circuit board 6 is increased.

On the other hand, in the semiconductor module 100 according to the first embodiment of the present disclosure, the flat or planar surface of the circuit board 6 is oriented in the Z-direction and also extends perpendicular to the extending direction of the interface between the metal substrate 1 and the insulating substrate 2, and is located to not overlie the area above the semiconductor element 3 and the bonding wire 9 in the Z-direction. When the surface of the circuit board 6 is oriented in the Z-direction and extends perpendicular to the extending direction of the interface between the metal substrate 1 and the insulating substrate 2, the stress on the silicone gel 8 due to thermal deformation of the circuit board 6 is reduced. The reduction of the tensile stress reduces the possibility that the interface between the circuit board 6 and the silicone gel 8 peels and the insulating and moisture barrier properties of the silicone gel 8 are lost.

In addition, since the circuit board 6 is disposed so as to not overlie the bonding wire 9, the bonding wire 9 is not lifted off the semiconductor element 3 and the electrode extraction pad 4 by the tensile stress in the silicone gel 8 resulting from thermal deformation. Therefore, it is possible to prevent a connection failure of the bonding wire 9 at the joining portion thereof with the surface electrode of the semiconductor element 3 and the electrode extraction pad 4.

Further, reducing the tensile stress in the silicone gel and where it interfaces with other elements of the semiconductor module 100 can prevent a crack from occurring at a corner of the insulating substrate 2. The possibility of the occurrence of a crack can be reduced without reducing the effective area of the circuit board 6 due to enlargement of the opening as shown in FIG. 4.

As described above, in the semiconductor module 100 according to the first embodiment of the present disclosure, the stress in the silicone gel 8 and on the interface thereof with other semiconductor module 100 components due to the thermal deformation of the circuit board 6 is relieved, and the pulling of the bonding wire 9 from the joining interface thereof with the surface electrode of the semiconductor element 3 and the electrode extraction pad 4, and the peeling of the joining interfaces between the insulating substrate 2 and the silicone gel 8, and the semiconductor element 3 and the silicone gel 8, are suppressed. Therefore, the semiconductor module 100 has reduced dielectric breakdown and reduced resultant failures.

While an embodiment has been described herein, the embodiment has been presented by way of example only, and is not intended to limit the scope of the inventions. Indeed, the novel elements and features described herein may be embodied in a variety of other forms; furthermore, various omissions, substitutions and changes in the form of the embodiment described herein may be made without departing from the spirit of the invention. Those skilled in the art may suitably select, from known techniques, the specific configuration of each element included in the embodiment. The accompanying claims and their equivalents are intended to cover such forms or modifications as would fall within the scope and spirit of the invention.

What is claimed is:

1. A semiconductor module comprising:
    a metal substrate having a mounting surface;
    a first conductive plate on the mounting surface;
    an insulating substrate on the first conductive plate;
    a second conductive plate on the insulating substrate;
    a conductive pad on the insulating substrate;
    a semiconductor element on the second conductive plate;
    a circuit board electrically connected to the conductive pad;
    a resin case connected to the metal substrate and extending along at least a portion thereof, and around the first conductive plate, the insulating substrate, the second conductive plate, the conductive pad, the semiconductor element, and the circuit board; and
    a silicone gel in a region bounded by the metal substrate and the resin case, wherein
    the circuit board comprises a plurality of planar surfaces oriented perpendicular to the mounting surface of the metal substrate.

2. The semiconductor module according to claim 1, wherein the circuit board extends along less than an entire perimeter of silicone gel.

3. The semiconductor module according to claim 2, wherein the circuit board includes a plurality of planar portions connected by at least one curved portion.

4. The semiconductor module according to claim 1, further comprising:
    a bonding wire extending between the second conductive plate and the conductive pad in a first direction different than a second direction along which the circuit board is oriented.

5. The semiconductor module according to claim 1, further comprising:
    an auxiliary terminal located between the circuit board and the conductive pad.

6. The semiconductor module of claim 5, wherein the circuit board comprises:

a flexible portion, and a second portion that is physically connected to the auxiliary terminal.

7. The semiconductor module of claim 1, wherein the circuit board includes a portion thereof extending outwardly of the silicone gel.

8. The semiconductor module according to claim 1, wherein the circuit board includes a signal terminal and a gate resistor, and the circuit board includes a plurality of curved portions extending between adjacent planar surfaces thereof.

9. A semiconductor module having a conductive substrate having a generally planar upper surface facing inwardly of the module, an insulating substrate thereover having a generally planar upper surface facing inwardly of the module, a semiconductor device substrate over the insulating substrate, and a semiconductor device chip mounted on the semiconductor device substrate, said semiconductor module comprising:

a circuit board electrically connected to the semiconductor device chip, the circuit board located only between the perimeter of the insulating substrate and the perimeter of the conductive substrate.

10. The semiconductor module of claim 9, further comprising:

a protective material overlying the conductive substrate, the insulating substrate and the semiconductor device substrate, and contacting a sidewall of the circuit board.

11. The semiconductor module of claim 9, wherein the circuit board includes a generally planar sidewall oriented perpendicular to the generally planar upper surfaces of the conductive substrate and the insulating substrate.

12. The semiconductor module of claim 9, further comprising:

a conductive pad between the semiconductor device substrate and the circuit board; and a conductive wire connected to, and between, the conductive pad and the semiconductor device chip.

13. The semiconductor module of claim 12, further comprising:

a conductive terminal electrically connected to, and between, the conductive pad and the circuit board.

14. The semiconductor module of claim 13, wherein the protective material comprises a silicone gel located over the conductive substrate and the insulating substrate; and the circuit board includes at least two generally planar portions and a flexible portion, the generally planar portions connected together by the flexible portion.

15. A method of manufacturing a semiconductor module, comprising:

providing a conductive substrate having a generally planar upper surface;

affixing an insulating substrate on the conductive substrate, the insulating substrate having a generally planar upper surface;

positioning a semiconductor device substrate over the insulating substrate;

providing a circuit board only between a perimeter of the insulating substrate and a perimeter of the conductive substrate, the circuit board electrically to a semiconductor device chip mounted on the semiconductor device substrate; and locating a protective material over the upper surfaces of the conductive substrate and the insulating substrate.

16. The method of claim 15, further comprising:

configuring the circuit board to include generally planar rigid portions connected by curved portions, wherein two rigid portions are spaced from one another by a portion of the protective material disposed therebetween.

17. The method of claim 16, wherein the protective material is a silicone gel.

18. The method of claim 15, wherein the semiconductor device chip is connected to the circuit board by:

providing conductive pad between the semiconductor device substrate and the circuit board;

connecting a conductive wire between the conductive pad and the semiconductor device substrate, and;

connecting an auxiliary terminal between the conductive pad and the circuit board.

* * * * *